United States Patent [19]
Cochran et al.

[11] Patent Number: 5,298,799
[45] Date of Patent: Mar. 29, 1994

[54] SINGLE-SHOT CIRCUIT WITH FAST RESET

[75] Inventors: David B. Cochran, Westlake, Ohio; Kathleen M. Owczarski, Wappingers Falls, N.Y.

[73] Assignee: International Business Machines Corporation, Armonk, N.Y.

[21] Appl. No.: 999,050

[22] Filed: Dec. 31, 1992

[51] Int. Cl.$^5$ .......................................... H03K 3/284
[52] U.S. Cl. .................... 307/273; 307/602; 328/207
[58] Field of Search ............. 307/265, 273, 291, 601, 307/602, 606; 328/58, 207

[56] References Cited

U.S. PATENT DOCUMENTS

| | | | |
|---|---|---|---|
| 3,601,636 | 8/1971 | Marsh, Jr. | 307/273 |
| 3,768,026 | 10/1973 | Pezzutti | 307/273 |
| 4,423,338 | 12/1983 | Eardley | 307/273 |
| 4,583,008 | 4/1986 | Grugett | 307/265 |
| 4,800,295 | 1/1989 | Minuhin et al. | 307/273 |
| 4,843,255 | 6/1989 | Stuebing | 307/273 |
| 4,994,687 | 2/1991 | Fuji et al. | 307/291 |

FOREIGN PATENT DOCUMENTS

| | | | |
|---|---|---|---|
| 0261215 | 11/1987 | Japan | 307/273 |
| 1202036 | 12/1985 | U.S.S.R. | 307/273 |

OTHER PUBLICATIONS

Instrum. & Exp. Tech. (U.S.A.) vol. 22, No. 2, Budyashov et al, "Multifunctional Wideband Single-Shot Multivibrator", Oct. 1979, pp. 447-450.

*Primary Examiner*—William L. Sikes
*Assistant Examiner*—Terry D. Cunningham
*Attorney, Agent, or Firm*—Whitham & Marhoefer

[57] ABSTRACT

The provision of a clock chopper, pulse shaper, single-shot circuit with NOR gates a delay path and a set-reset latch. In response to a high input (for example) to a first NOR gate, the circuit output goes high and remains high until the output of the one NOR gate propagates through the delay one input of a second NOR gate whose other input is coupled to a set-reset latch. When the delayed output of the first NOR gate reaches the input of the second NOR gate, the circuit output falls, and the change in circuit output is fed back to reset the latch. The change in latch state changes the output state of the second NOR gate and resets the circuit for next input.

7 Claims, 4 Drawing Sheets

SINGLE-SHOT CIRCUIT WITH FAST RESET

BACKGROUND OF THE INVENTION

1. Field of the Invention

This invention relates to an improved single-shot circuit that functions both as a clock chopper and pulse shaper to generate a local clock signal from a master clock signal, and more particularly to a single-shot circuit with a fast reset.

2. Description of the Prior Art

In digital logic systems, single-shot circuits can function as a so-called clock chopper to generate on a chip local clock signals from a master clock signal. The master clock signals are generated by a common clock generator and these master clock pulses are distributed throughout the logic system to provide timing signals at a particular time within the repetitive clock cycle established by the master clock. The master clock pulses, however, may not be suitable for the purpose of controlling the operation of the circuits on a given chip in the digital logic system. In this case, a clock chopper circuit on the chip generates a suitable set of on-chip clock pulses from the system master clock input.

The single-shot circuit clock chopper creates an active output pulse of a predetermined width when triggered by an input signal edge. In response to a periodic input signal, the single shot should generate a series of active output pulses each with the same predetermined pulse width. The inactive period required by the single shot to correctly reset without changing the output pulse width determines the minimum period of the input pulses.

Such on-chip clocking circuits for certain logic designs must operate in two modes. The first required mode is a chop mode. The second requirement is that the on-chip clock pulse width must be measured in terms of frequency. The frequency measurement is accomplished by configuring the chopper circuit into a recirculating loop and measuring its characteristic frequency. This Recirculating Loop Frequency (RLF) mode of the chopper is required to improve the accuracy of the pulse width measurement. It is important that the RLF pulse measured is equal to the pulse generated during normal operation. When the time allowed for the delay element to recovery is different during RLF mode and normal mode, error will occur in the measurement of large pulse widths.

Clock Chopper circuits in current logic designs also must function as pulse shapers. The externally generated input clock pulse width is generally designed to be 50% of the cycle time. Since logic function times can often be more than 50% of cycle times, many logic designs require "stretched" pulses. The maximum pulse width that any pulse shaper can create is limited by the minimum time needed to reset the pulse shaper before a new pulse can be generated. The reset delay must be less than the pulse shaping delay in order to make a pulse greater than 50% of the cycle time.

Another concern arises when stretched pulses are being generated. The delay element used to form the pulse must have enough time to recover from making the last pulse before making the next pulse. A lack of sufficient recovery time often causes the first few pulses generated to be of different widths until a stable state is reached. The widest pulse that any pulse shaper can produce is determined by the reset time of the pulse shaper circuit and the recovery time of its delay element. The reset and recovery time becomes a crucial limitation to pulse shaper designs when cycle times become faster.

Several methods have been proposed in the prior art to address the reset and recovery time concern in clock chopper circuits. These include:

a. Two pulse shapers running at a slower cycle time and OR-ing result.

b. Forced reset of a chain of elements after pulse shaping.

c. OR-ing a chain of blocks together (One block high resets chopper).

The maximum width that can be created by these prior art methods is limited by the minimum reset time of the pulse shaper and the recovery time of the delay element. Methods b and c force the reset to be dominated by the recovery time of one delay block in a chain of delay blocks. Method 1, which can be used with a chain of delay blocks or one large delay element, doubles the recovery time allowed by dividing the cycle time in half. Method 1 also takes twice as much space as would Methods b or c and it requires an input clock divide by two circuit.

In a delay circuit that uses capacitive elements of a certain time constant to create a delay after each input signal swing, the delay through the circuit is constant only if the active elements are allowed to fully discharge or charge before switching again. If the circuit input signal is forcing the circuit to switch at a speed that is faster than the time constant of the storage device, then the circuit delay will vary with the switching speed of the input signal. In other words, the value of delay through the chain depends on the input stimulus duty cycle.

The recovery time concern becomes even more important when trying to use the clock circuits in RLF mode to measure array timings. The pulse width generated by the circuit can be varied until the appropriate timing is achieved. The circuit is then reconfigured to oscillate at a frequency that represents this pulse width, in order to do this, the delay chain is configured into a ring oscillator by inverting the output of the delay chain and feeding it back to the first block of the chain. The delay chain will then oscillate at the natural delay of the chain with a duty cycle of approximately 50%.

SUMMARY OF THE INVENTION

It is there an object of the invention is the provision of a single shot, clock chopper that provides a stable chain of wide pulses.

A further object of the invention is the provision of a single shot, clock chopper, that can generate RLF signals to measure the pulse width with minimal error.

A still further object of the invention is a circuit that has low power and chip area requirements.

Briefly, this invention contemplates a single-shot circuit in which a pair of gates are interconnected to provide an output pulse in response to a clock input. The output pulse width is determined by a propagation delay of the output from one gate to an input to the other gate. A set-reset latch is set by the end of pulse edge and immediately changes the output of the other NOR gate.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
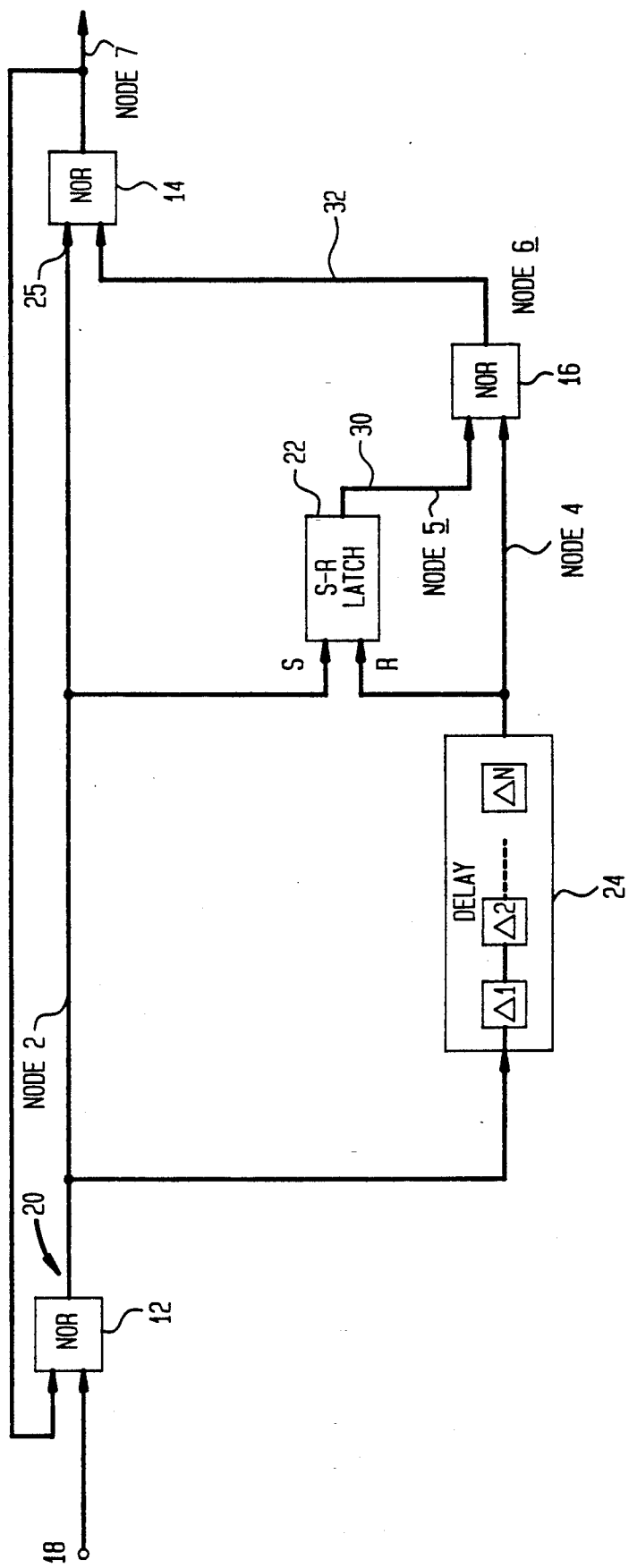
FIG. 1 is a schematic diagram of one embodiment of a single-shot circuit clock chopper in accordance with the teachings of this invention.

Referring now to FIG. 1, a single-shot, clock chopper circuit in accordance with the teachings of this invention has an external master clock input NOR gate 12, an internal clock pulse output NOR gate 14 and a NOR gate 16. A clock signal input 18 is coupled to one of input NOR 12 and its output lead 20 is coupled to an input 25 of NOR gate 14 and also a set input(s) of a conventional set-reset latch 22 such as described in *Logic Design Principles,* by Edward J. McCluskey, Stanford University, copyright 1986 by Prentice-Hall, pp. 275–277. A delay network 24 (typically comprised of a series of connected R-C delays $\Delta 1$ through $\Delta N$) couples the output 20 of NOR gate 12 to one input of NOR gate 16 and to a reset (R) input of set-reset latch 22. The output 30 of latch 22 is coupled to the other input of NOR gate 16 and the output 32 of this gate is coupled as the other input to output gate 14. The output 34 of gate 14 is fed back as the other input to gate 12. As those skilled in the art will appreciate, the circuit shown in FIG. 1, apart from the latched reset provided by set-reset latch 22, is a conventional single-shot circuit described in U.S. Pat. No. 3,601,636, among other places.

Figure 2:
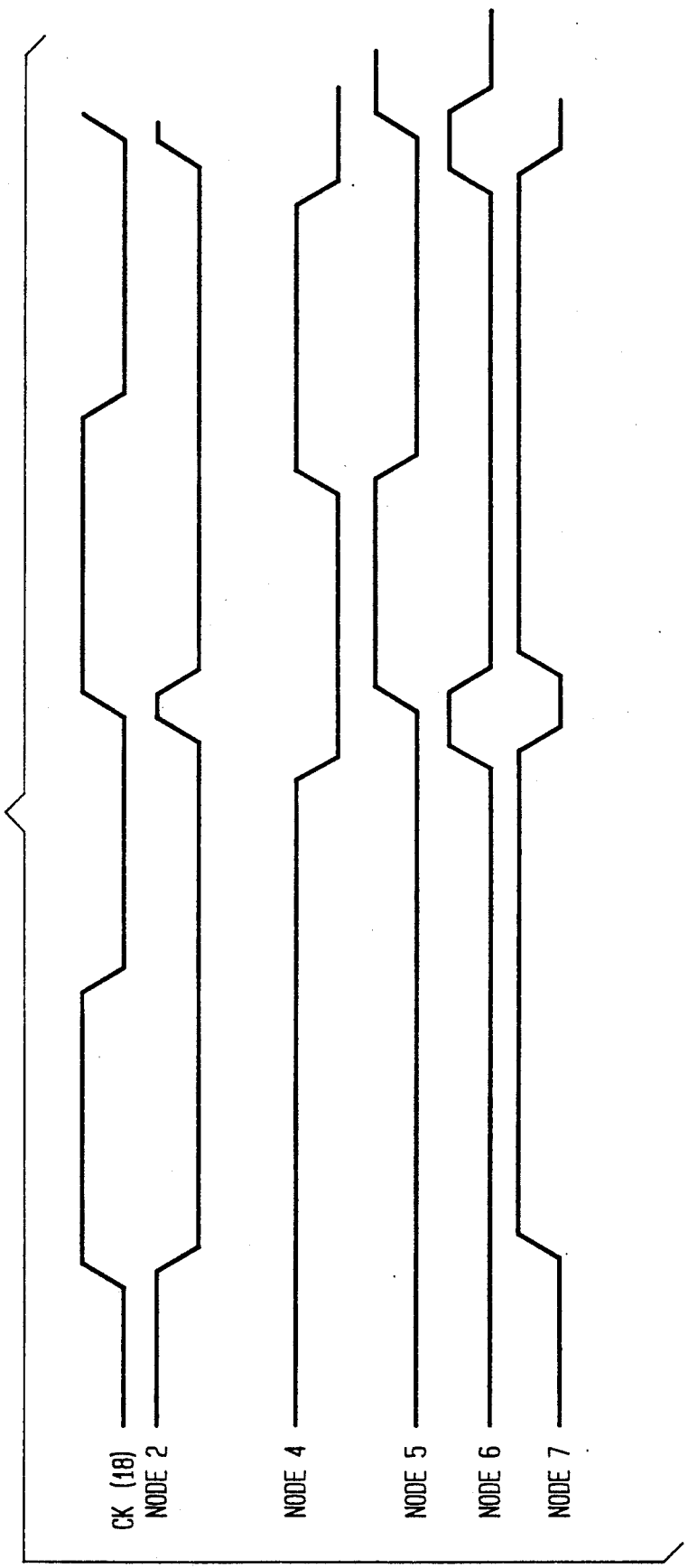
FIG. 2 is a timing diagram showing the logic level states at various nodes during the operation of the circuit of FIG. 1.

Referring now to FIG. 2 in addition to FIG. 1, the basic operation of the circuit in pulse formation is that of a conventional single shot of the type described above. Briefly, assuming an initial condition where the clock input on line 18 is low, the output of gate 12 (node 2) is high as is its delay coupled input to gate 16 (node 4). The output of latch 22 (node 5) is low and the output of gate 16 (node 6) is therefore also low as is the output of the gate 14 (node 7). During the pulse formation phase of the operation, it should be noted, the output of the latch 22 is always low.

The rising edge input clock triggers node 2 to fall. Node 2 falling causes the output node 7 to rise, starting the pulse formation stage of the circuit operation. After a falling edge at node 2, the latch 22 switches to its reset state so node 5 stays low. The falling edge at node 2 propagates through the delay chain 24 and produces a falling edge when it reaches node 4. When node 4 goes low, latch 22 holds its previous low state. The low state at nodes 4 and 5, the inputs to gate 16, cause its output (node 6) to rise. The rising edge at node 2 signals the end of the output pulse in response to the rising edge of the clock pulse input, and the circuit output, node 7, falls.

The purpose of S-R circuit is to "latch" the reset circuit. A falling edge on node 7 causes the internal node 2 to rise (assuming the input clock has gone LOW). When node 2 goes HIGH, this signals that the current pulse being created is complete. The output of the S-R latch (node 5) is "set" high when node 2 goes high causing node 6 to go low. Node 6 is held low by a high level at node 5 since node 6 is a NOR of nodes 4 and 5. When node 4 goes high the latch is "reset" to low, but node 6 will still be held low since node 4 is high, first. Using the latch 22, the output of the circuit is undisturbed if node 4 is low before the next pulse occurs. In other words, the delay chain does not need to be completely reset before the next input clock rising edge.

It should be noted, the S-R latch always goes to a known state and is slightly unbalanced to allow it to go to a known state during power on.

The reset time of the circuit is much faster than the prior art because it does not include any delay circuits. The reset time is only the delay through five NOR circuits, which are all fast relative to the delay circuits which contain large capacitances.

Figure 3:
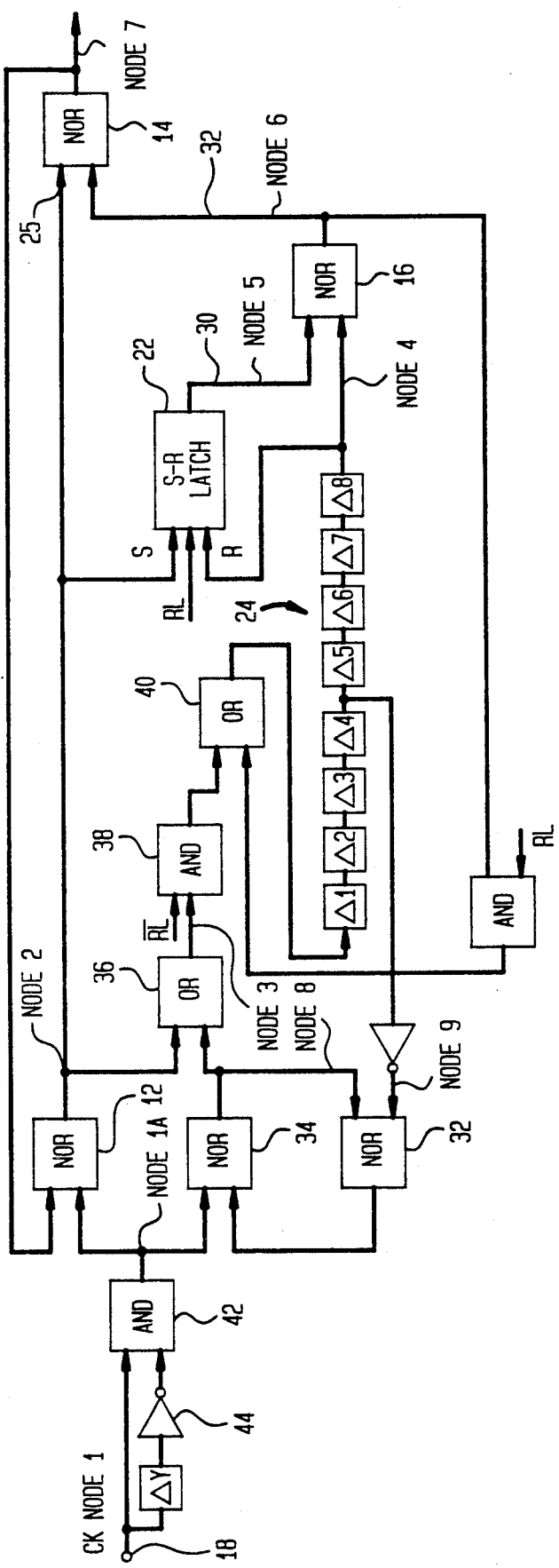
FIG. 3 is a schematic diagram of a preferred embodiment of the invention.
Figure 4:
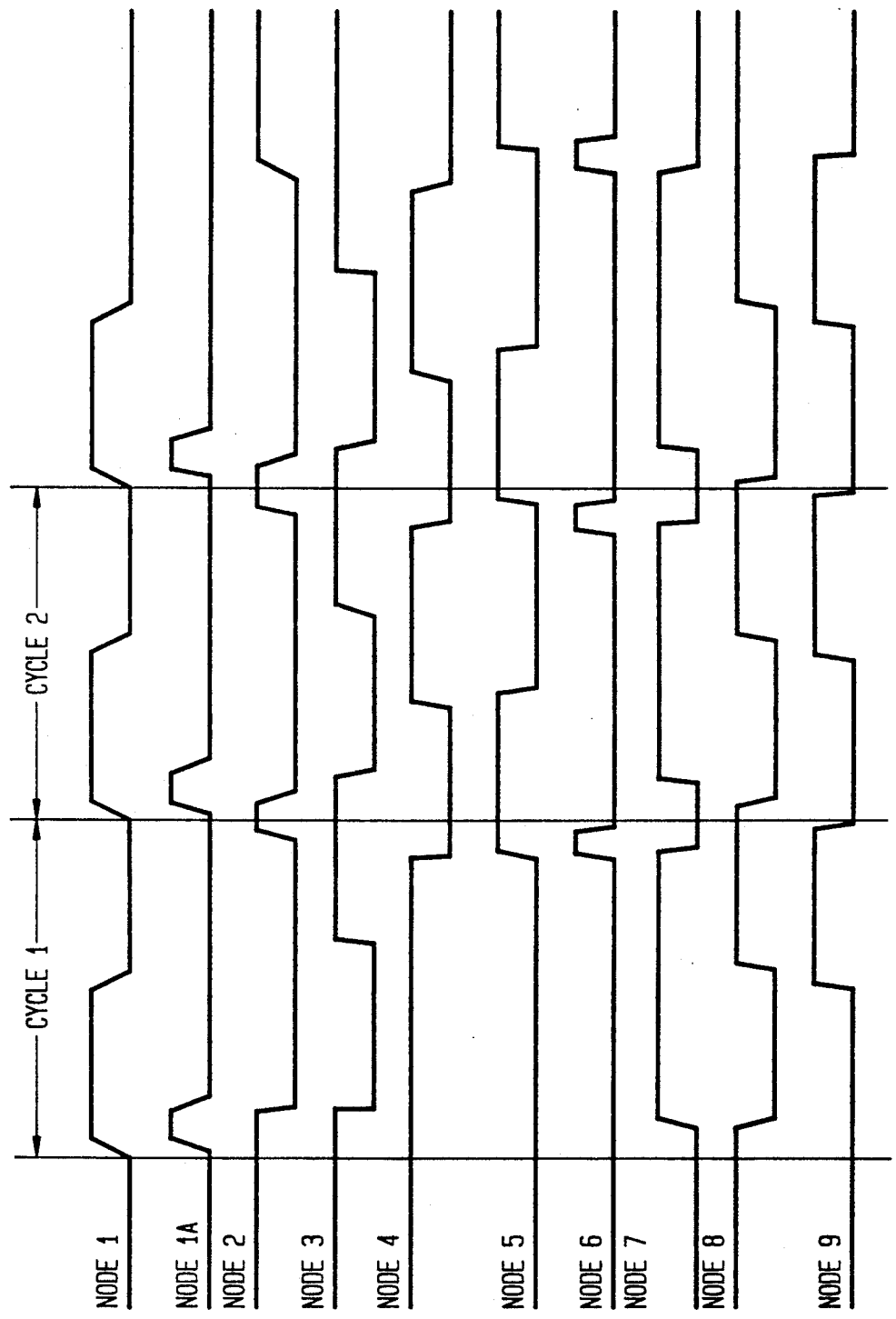
FIG. 4 is a timing diagram showing the logic level states at various nodes during the operation of the circuit of FIG. 3.

Referring now to FIGS. 3 and 4, the general circuit organization and operation of this preferred embodiment of the invention is in most respects the same as that described in connection with FIG. 1 and 2, and like reference numbers have been used to identify like components and nodes. The single-shot operation requires a low state on input RL and a high state on RL.

A pulse shaper circuit comprised of gates 32, 34, 36, 38 and 40 has been added to provide for an early reset of the delay circuits 24. This added pulse shaper detects when the fourth delay circuit ($4\Delta$) of a series of eight relay circuits 24 has completed its operation in the active pulse formation phases of the single-shot operation. A falling edge at the output of the fourth delay circuit ($\Delta 4$) is inverted at node 9 and triggers the signal at node 8 to rise, which begins the recovery phase for all the delay circuits 24.

A rising edge detector comprised of gate 42, delay $\Delta y$ and invertor 44 eliminate restrictions on the input clock duty cycle. The edge detector circuit is a simple pulse chopper type circuit that creates a narrow positive active pulse after a rising edge on the input signal is detected. The width of the narrow pulse is selected ($\Delta y$) to guarantee that node 1A falls to low after node 9 returns to low.

Another important improvement gained by using the configuration in FIG. 3, is that the error in the RLF (Recirculating Loop Frequency) measurement of the active pulse width is reduced. Single shots, in general, can be configured into an RLF as in the circuit of FIG. 3 by applying a single rising edge signal at the RL input and a falling edge on RL input, while the input at node 1 is low. The signal that appears at node 6 can be used to measure the width of the active output pulse of the single shot in frequency rather than time. The method relies on the delay in single-shot mode and RLF mode being the same. In order to guarantee this, the recovery time allowed for the delay elements must be similar in both modes. The circuit of FIG. 3 minimizes RLF measurement error because the difference in delay element recovery time between RLF and single-shot mode is reduced.

In operation, a rising edge input at node 1 causes a falling edge at nodes 2 and 8. The falling edge at node 2 causes a rising edge at the output node 7, since node 6 is at a low state. Node 2 is held low by either the high level at node 1 or at node 7, whichever maintains this state for the longer period. The falling edge at node 2 begins the propagation of a falling edge through the delay elements 24 ending at node 4. The output state of the S-R latch 22 (node 5) is determined by the state of the signals on node 2 which is the "set" node and node 4 which is the "reset" node. When node 2 falls to a low state while node 4 is high, node 5 is "reset" to the low state. Node 4 falling to low leaves the S-R latch in the hold state so node 5 remains low. Node 6 rises to a high state following the falling edge at node 4. Then, node 7 is returned to the low state ending the active output pulse of the single shot. The reset of the single shot then begins. Node 2 returns to the high state (assuming node 1A is low) which is guaranteed by the edge detector.

It should be noted that the reset of the delay elements (a rising at node 4) does not control the reset operation of the single shot. The delay elements are allowed to recover at anytime after a falling edge propagates to its (the individual delay element's) output. The S-R latch separates the single shot reset operation from the delay element recovery operation. The disclosed configuration gains additional recovery time for the delay elements by allowing the delay elements to begin resetting prior to the completion of the active output pulse.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A single shot, clock chopper comprising in combination:
   a first gate and a second gate each having a pair of inputs and an output;
   means to couple a master clock signal to one input of said first gate;
   means coupling said output of said first gate to one input of said second gate;
   means coupling said output of said second gate to the other input of said first gate;
   delay means for coupling said output of said first gate to another input of said second gate via a third gate having one input coupled to an output of said delay means and an output coupled to another input of said second gate;
   a set-reset latch having a set input, a reset input and an output;
   said set input coupled to said means coupling said output of said first gate to one input of said second gate;
   said reset input coupled to said output of said delay means; and
   said set-reset latch output coupled to another input of said third gate so that a change of state in said output of said first gate sets said set-reset latch, said output of said delay means resets set-reset latch, and a change in output of said set-reset latch changes the output state of said third gate.

2. A single shot, clock chopper as in claim 1, wherein said first gate, said second gate and said third gate are NOR gates.

3. A single shot, clock chopper as in claim 1, wherein said delay means is a plurality of series connected discrete delay elements including an initial delay element, an intermediate delay element, and a final delay element.

4. A single shot, clock chopper as in claim 3, further including means responsive to said intermediate delay element to reset an input to said delay circuit.

5. A single-shot clock chopper as in claim 1, further including means to generate a narrow pulse input to said one input of said first gate in response to said master clock signal.

6. A single shot, clock chopper as in claim 2, wherein said delay means is a plurality of series connected discrete delay elements including an initial delay element, an intermediate delay element, and a final delay element.

7. A single-shot clock chopper as in claim 2, further including means to generate a narrow pulse input to said one input of said first gate in response to said master clock signal.

* * * * *